United States Patent [19]

Muramoto et al.

[11] Patent Number: 4,985,342

[45] Date of Patent: Jan. 15, 1991

[54] POLYSILOXANE PATTERN-FORMING MATERIAL WITH SIO$_{4/2}$ UNITS AND PATTERN FORMATION METHOD USING SAME

[75] Inventors: Naohiro Muramoto, Chiba; Katsutoshi Mine, Ichihara, both of Japan

[73] Assignee: Toray Silicone Company, Ltd., Tokyo, Japan

[21] Appl. No.: 268,109

[22] Filed: Nov. 7, 1988

[30] Foreign Application Priority Data

Nov. 9, 1987 [JP] Japan ............................... 62-286638

[51] Int. Cl.$^5$ .......................... G03C 1/72; G03F 7/075
[52] U.S. Cl. .................................... 430/280; 430/270; 430/281; 430/325; 430/313; 522/99
[58] Field of Search .................... 528/30, 32; 430/270, 430/325, 280, 281, 313; 522/99

[56] References Cited

U.S. PATENT DOCUMENTS

| | | | |
|---|---|---|---|
| 4,376,210 | 3/1983 | Chang | 522/99 |
| 4,579,789 | 7/1985 | Kroupa | 528/15 |
| 4,677,161 | 6/1987 | Suzuki et al. | 524/862 |
| 4,722,881 | 2/1988 | Ueno et al. | 430/192 |
| 4,786,701 | 11/1988 | Tanaka | 528/15 |
| 4,839,109 | 6/1989 | Kaetsu et al. | 522/99 |
| 4,861,807 | 8/1989 | Preiner et al. | 522/99 |
| 4,863,833 | 9/1989 | Fukuyama et al. | 430/325 |
| 4,889,905 | 12/1989 | Suzuki | 528/30 |

FOREIGN PATENT DOCUMENTS 207041 12/1983 Japan .
212756 10/1985 Japan .
20032 1/1986 Japan .

*Primary Examiner*—Marion C. McCamish
*Assistant Examiner*—Christopher D. RoDee
*Attorney, Agent, or Firm*—Roger H. Borrousch

[57] ABSTRACT

Pattern-forming material useful in producing highly accurate submicron patterns having unusually high aspect ratios at superior resolutions are obtained by using a solvent-soluble polyorganosiloxane having SiO$_{4/2}$ units and at least one other organosiloxane unit which contains a high energy radiation sensitive group. The polyorganosiloxane has a softening temperature greater than room temperature.

17 Claims, No Drawings

POLYSILOXANE PATTERN-FORMING MATERIAL WITH SIO$_{4/2}$ UNITS AND PATTERN FORMATION METHOD USING SAME

BACKGROUND OF THE INVENTION

1. Field of the Invention

The present invention relates to a negative pattern-forming material for the purpose of forming highly accurate patterns in desired configurations on a substrate. In particular, the present invention relates to a pattern-forming material which is ideal as a mask highly resistant to the dry etching of an underlying organic material, for example, an organic insulating material or an organic planarizing layer as used in multilayer resist methods, as encountered in, for example, microprocesses in the fabrication of semiconductor devices. The present invention also relates to a pattern formation method which uses the aforesaid pattern-forming material.

2. Background Information

According to current trends toward higher densities in semiconductor devices, for example, in IC's and LSI's, both a microminiaturization of unit elements and a reduction in pattern line widths are underway, and submicron patterns will be entering into the stage of practical utilization. With regard to the formation of the corresponding micropatterns, within the field of photolithography attention has been directed at lithography using, for example, deep UV, electron beams, and X-rays, as exposure sources having excellent short-time resolving powers among the various wavelengths. In order to form high-resolution high-aspect ratio resist micropatterns using this type of lithography, the resist film must be thin and must also have a uniform thickness in order to minimize effects such as, for example, backscatter from the substrate and forward scatter. However, as in the case when circuitry has already been formed prior to such a resist coating, or in the case of the formation of multilayer circuitry or elements with a three-dimensional array structure, among others, the substrate on which the resist pattern must be formed is often not flat, and it is very difficult to form thin, defect-free (e.g., without pinholes, etc.) resist layers on such substrates. Furthermore, when the resist surface is not flat as a consequence of substrate topography, effects such as a variable electron beam dosage and scatter readily occur, and it becomes difficult to direct the process toward the formation of a micropattern with the desired layout. This makes it necessary to increase the film thickness in order to planarize the resist surface. Furthermore, a too thin resist film is undesirable from the standpoint of its resistance to dry etching, which has recently entered into widespread use.

Multilayer resist strategies have been proposed in order to meet these conflicting demands. For example, in a trilayer structure, the substrate is planarized by a first layer of an organic polymer, and this is covered with an intermediate layer of an inorganic material which is highly resistant to oxygen ion etching, for example, a silicon dioxide film or vapor-deposited metal film. On this is then formed a thin resist layer. It is this resist layer which is patterned by exposure and development, and the obtained resist pattern is then used as a mask for processing of the intermediate layer by dry etching. The image patterned into the intermediate layer is then used as a mask for the processing of the thick organic polymer first layer by oxygen ion etching, thus finally providing a micropattern on the substrate. The third layer, the resist layer, is removed during the ion etch.

With regard to the advantages of this trilayer resist approach, it becomes possible to obtain an ultramicrofine pattern through the use of a thin resist third layer, and the use of a highly dry etch-resistant organic polymer layer as the first layer makes it possible to obtain a highly dry etch-resistant resist film.

However, this methodology has the disadvantage of substantially increasing the number of processes. A bilayer resist strategy has been proposed in response to this. In the bilayer resist approach, a thin resist layer is placed on an organic polymer layer. After formation of a resist pattern, it is used as a mask for etching the organic polymer using an oxygen plasma. Thus, in a bilayer resist, the upper resist layer must have a fairly good oxygen plasma resistance, that is, resistance to oxygen ion etching, at the same time that it has a high sensitivity and high resolvability. Resist materials having a good oxygen ion-etch resistance have been proposed in the form of silicon-containing polymers into which highly sensitive groups have been introduced as described by Nippon Electric KK in Japanese Patent Application Laid Open [Kokai or Unexamined] Numbers 58-207041 [207,041/83], published December 2, 1983; by Nippon Telegraph and Telephone in Japanese Laid Open Application No. 60-212756 [212,756/85], published October 25, 1985; and by Nippon Telegraph and Telephone in Japanese Laid Open Application No. 61-20032 [20,032/86]), published Jan. 28, 1986.

SUMMARY OF THE INVENTION

Problems to Be Solved by the Invention

However, the existing silicon-containing resists nevertheless have an inadequate oxygen ion-etch resistance, which makes a larger film thickness unavoidable. This in turn causes a decline in resolution.

An object of the present invention is to solve the problems residing in this prior art by introducing a negative pattern-forming material which is sensitive to high-energy radiation and which has an excellent oxygen ion-etch resistance, and by introducing a pattern formation method using this material.

Means Solving the Problems and Function Thereof

The invention of the present application relates to a pattern-forming material which is sensitive to high-energy radiation, and more particularly relates to a pattern-forming material comprising a solvent-soluble polyorganosiloxane having SiO$_{4/2}$ units and at least one other organosiloxane unit, said polyorganosiloxane has a softening temperature greater than room temperature, and contains in each molecule at least one group sensitive to high-energy radiation.

The invention of the present invention also relates to a method for the formation of a pattern on a substrate comprising forming on a substrate a film of the pattern-forming material, then selectively rendering areas of this film insoluble to a liquid developer by selectively exposing the film to high-energy radiation, and thereafter removing the film in the unexposed areas using the liquid developer.

This invention also relates to a method for the formation of a pattern on a substrate comprising forming a layer of an organic polymer on the substrate, placing over the organic polymer a layer of the pattern-forming material, insolubilizing the pattern-forming material by exposure to high-energy radiation in a desired pattern, forming a pattern on the organic polymer layer by removal of the unexposed regions using liquid developer, and, using this pattern as a mask, the regions of said organic polymer layer not covered with said polyorganosiloxane are removed by dry etching with the oxygen ion.

DESCRIPTION OF THE PREFERRED EMBODIMENTS

With regard to the $SiO_{4/2}$ siloxane unit which is an essential constituent unit of the pattern-forming material in the invention of the present application, it is this unit which is crucial for increasing both the oxygen ion-etch resistance and softening temperature of the material under consideration, and it preferably comprises 10 to 90 mole % of the total constituent siloxane units. At below 10 mole %, the oxygen ion-etch resistance tends to become inadequate and the softening temperature will fall below room temperature, while exceeding 90 mole % causes a declining solvent solubility. Preferably, the polyorganosiloxane contains from 45 to 65 mole % $SiO_{4/2}$ units.

On the subject of the other organosiloxane unit, which is the other essential constituent unit, there is at least one unit species selected from the group consisting of a siloxane unit with the general formula $R^1SiO_{3/2}$, a siloxane unit with the general formula $R^2R^3SiO_{2/2}$, and a siloxane unit with the general formula $R^4R^5R^6SiO_{1/2}$. In this formulae, $R^1$ through $R^6$ are hydrogen, the hydroxyl group, or a monovalent organic group. These monovalent organic groups are exemplified by alkyl groups such as methyl, ethyl, hexyl, etc.; haloalkyl groups such as 1-chloromethyl, 2-chloroethyl, 3-chloropropyl, etc.; aralkyl groups such as 2-phenylethyl, 2-phenylpropyl, etc.; alkenyl groups such as vinyl, allyl, etc.; the phenyl group; and alkoxy groups such as methoxy, ethoxy, etc. The groups $R^1$ through $R^6$ within a single molecule may be identical or may vary, but at least one group from among the groups $R^1$ through $R^6$ present in each molecule must be a group sensitive to high-energy radiation. Groups sensitive to high-energy radiation are, for example, hydrogen bonded to silicon, alkyl groups having at least 2 carbon atoms such as the ethyl group, n-propyl group, isopropyl group, and tert-butyl group; halogenated hydrocarbon groups such as the 1-chloromethyl group, 2-chloroethyl group, and p-chlorophenyl group; alkenyl groups such as the vinyl group and allyl group; the 3-acryloxypropyl group; the 3-methacryloxypropyl group; the 3-acrylamidopropyl group; the 3-mercaptopropyl group; the 3-glycidoxypropyl group; the 2-(3,4-epoxycyclohexyl)ethyl group; the 3-aminopropyl group; the 3-(2-aminoethyl)aminopropyl group; the 2-(p-azidobenzoyl)ethyl group; and the 3-(p-azido-m-methylbenzoyl)propyl group, and groups adapted to the type of impinging high-energy radiation may be selected without restriction. Within the other organosiloxane units, are the siloxane units which contain the groups sensitive to high energy radiation. Furthermore, the individual molecule may contain two or more types of siloxane units which contain two or more types of sensitive groups. The types of groups $R^1$ through $R^6$ in the individual molecule, their proportions, and the molar proportions among the respective organosiloxane units are, among others, also not specifically restricted. From the standpoints of increasing the softening temperature and oxygen ion-etch resistance, it is preferred that the $R^2R^3SiO_{2/2}$ unit not constitute more than 30 mole % of the total siloxane constituent units and that the molar proportions of the respective siloxane units and the types of groups $R^1$ through $R^6$ be selected in such a manner that the Si content of the polyorganosiloxane molecule falls within the range of 10 to 45 weight %. The polyorganosiloxane preferably contains from 30 to 45 weight % Si.

Preferred pattern-forming materials are those polyorganosiloxanes which contain $SiO_{4/2}$ units in an amount of from 45 to 65 mol %, contain from 30 to 45 weight % Si, contain the other organosiloxane units in an amount of from 35 to 55 mol % where they consist essentially of 0 to 35 mol % trimethylsiloxy units and 4 to 45 mol % organosiloxane units with high-energy sensitive groups. These preferred pattern-forming materials have a softening temperature greater than 100 degrees Centigrade.

Illustrative of the preferred pattern-forming materials are those polyorganosiloxanes which contain from 4 to 30 mol % (monochloromethyl)dimethylsiloxy unit; those which contain from 10 to ,15 mol % (monochloromethyl)dimethylsiloxy units and from 15 to 20 mol % vinyldimethylsiloxy units; those which contain from 10 to 45 mol % siloxane units selected from the group consisting of vinyldimethylsiloxy unit, methylvinylsiloxane unit, vinylsilsesquioxane unit, and mixtures thereof; those which contain from 10 to 15 mol % vinyldimethylsiloxy units and from 10 to 15 mol % (isopropyl)dimethylsiloxy units; those which contain from 10 to 15 mol %

units; those which contain from 15 to 25 mol % gamma-mercaptopropylsilsesquioxane unit; those which contain from 10 to 30 mol % siloxane units selected from the group consisting of gamma-methacryloxypropylsilsesquioxane unit and (acryloxymethyl)dimethylsiloxy unit; those which contain from 5 to 10 mol % hydrogendimethylsiloxy unit; those which contain from 5 to 10 mol %

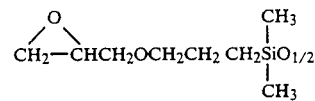

unit; those which contain from 10 to 25 mol % (isopropyl)dimethylsiloxy unit; and those which contain from 5 to 10 mol % (tertiary-butyl)dimethylsiloxy unit.

On the topic of the high-energy radiation to be used in the present invention' examples are ultraviolet radiation, deep ultraviolet radiation, excimer lasers, electron beams, ion beams, and X-rays. When the pattern-forming material contains alkenyl group or acrylic group as the sensitive group, the use of ultraviolet radiation, deep ultraviolet radiation, or the KrF excimer laser as the exposure source is preferred. Additives (sensitizers and/or crosslinkers, etc.) such as the following may be used in this case. The sensitizers are exemplified by benzoin compounds such as benzoin methyl ether, benzoin ethyl ether, benzoin isopropyl ether, etc.; azo compounds such as azobisisobutyronitrile, etc.; dye redox compounds in the form of combinations of dyes such as Methylene Blue, Eosin Y, etc., with a reductant such as sodium P-toluenesulfinate, etc.; sulfur-containing compounds such as dibenzothiazoyl disulfide, etc.; organoperoxides such as benzoyl peroxide, etc.; aromatic carbonyl compounds such as benzophenone, Michler's ketone, etc.; aminobenzoic acid esters such as isoamyl p-(N,N-dimethylamino)benzoate, etc.; aromatic nitro compounds such as nitrobenzene, p-nitrophenol, p-nitroaniline, etc.; thioxanthone compounds such as the 2,4-diethylthioxanthones; quinone compounds such as anthraquinone etc.; and acenaphthene compounds such as 5-nitroacenaphthene, etc. Examples of the crosslinkers are multifunctional acrylic compounds such as ethylene glycol di(methacrylate), trimethylolpropane tri(methacrylate), tetramethylolmethane tetra(methacrylate), N,N-methylenebis(methacrylamide), etc., and aromatic bisazide compounds such as 2,6-di(4'-azidobenzal)cyclohexanone, 2,6-di(4'-azidobenzal)4-methylcyclohexanone, sodium 4,4-diazidostilbene-2,2'-disulfonate, 4,4'-diazidochalcone, etc.

Small quantities of fillers and dyes, etc., may also be added with the objectives of improving the handling properties and adjusting the transmission, viscosity, and strength, etc., of the pattern-forming material of the present invention. The pattern-forming material of the present invention is a solid at room temperature, but despite its content of $SiO_{4/2}$ constituent, it is nevertheless soluble in a number of solvents, for example, hydrocarbons such as heptane, hexane, cyclohexane, etc.; aromatic hydrocarbons such as benzene, toluene, xylene, etc.; alcohols such as ethanol, isopropanol, etc.; ketones such as cyclohexanone, methyl isobutyl ketone, acetone, etc.; acetates such as isoamyl acetate and propyl acetate, etc.; chloroform; Cellosolves such as ethyl Cellosolve acetate, etc. Dissolved in such a solvent, which may be used either individually or in mixture, the pattern-forming material of the present invention can be formed into a thin, uniform film on the surface of the substrate by spin-coating over the substrate. This excellent solubility profile permits the selection of the coating solvent and developer solvent from a broad range, which facilitates the selection and use of a solvent suitable to the underlying materials.

In the method for the formation of a pattern on a substrate, the organic polymer to be used as the lower layer (or first layer on the substrate) is not specifically restricted, as long as, it can be removed by oxygen ion etching. Examples of the organic polymer are polyimide resins and the various widely and generally used organic resists such as phenol novolac systems and cyclized rubber systems, among others. It is preferred that it have a high heat resistance, a high oxygen etching rate, and a low halogen gas (for example, $CF_4$, etc.) ion etching rate. Additionally, coatings of at least 1.5 micrometers without the formation of striations or cracks should be possible. Also, organic polymers are preferred which have high absorptivities for the radiation used for patterning the pattern-forming material of this invention.

With regard to the development carried out after the patterning exposure of the pattern-forming material of this invention, methods such as spraying, dipping, etc., may be used, and no specific restriction pertains here, as long as, the pattern-forming material (unexposed pattern-forming material) is dissolved in the liquid developer. Examples of the liquid developers are the lower alcohols such as ethanol and isopropanol, ketones such as MIBK (methylisobutyl ketone), lower alkanes such as n-hexane and n-heptane, and aromatic hydrocarbons such toluene and xylene. A rapid development procedure will be preferred in order to avoid any alterations in the pattern due to longer development times. Also, a rinse may be conducted as desired using a suitable solvent, and this may or may not be followed by a postbake for the purpose of drying.

The pattern-forming material of this invention is easily synthesized by the co-hydrolysis or co-condensation, using a catalyst such as an organic base (e.g., triethylamine) or an acid (e.g., hydrochloric acid, sulfuric acid, trifluoromethanesulfonic acid), of tetraalkoxysilane or tetrahalosilane (in order to introduce the $SiO_{4/2}$ group) with silicon compounds appropriate for the introduction of the required other organosiloxane units, that is, organotrialkoxysilanes or organotrihalosilanes in order to introduce the $R^1SiO_{3/2}$ unit, diorganodialkoxysilanes or diorganodihalosilanes or diorganosiloxane oligomers in order to introduce the $R^2R^3SiO_{2/2}$ unit, and/or triorganomonoalkoxysilanes or triorganomonohalosilanes in order to introduce the $R^4R^5R^6SiO_{1/2}$ unit. The preceding silanes may also be used as their partial hydrolyzates. The $R^4R^5R^6SiO_{1/2}$ unit may also be introduced through the use of a silylating agent such as a hexaorganodisilazane.

EXAMPLES

The following examples are presented for illustrative purposes and should not be construed as limiting the present invention which is properly delineated in the claims. Illustrative preparative conditions and average compositional formulas for pattern-forming materials of the present invention and methods of using these pattern-forming materials are given in the following examples.

EXAMPLE 1

Into a four-neck flask equipped with a stirrer, reflux condenser, and thermometer were placed 35.8 g 1-chloromethyldimethylchlorosilane, 40 g concentrated hydrochloric acid, 60 g water, 20 g ethanol, and 30 g toluene. The resulting mixture was heated to 70 degrees Centigrade with stirring. From an addition funnel, 104 g tetraethoxysilane was dripped into this mixture over approximately 2 hours, and heating under reflux was continued for approximately 2 hours with stirring after the completion of addition. 100 mL water was added, and the lower layer was separated. This lower layer, that is, the polymer layer, was then washed with water and dehydrated azeotropically 20 g hexamethyldisilazane was added, and a reaction was carried out by heating under reflux with stirring for 6 hours. This reaction solution was then filtered, and the solvent was subsequently removed using an evaporator to afford a crude polymer as a white solid. This was dissolved in toluene to give a 10 weight % solution and then reprecipitated by pouring into approximately twenty-fold methanol. After the precipitate was collected by filtration, it was dried to a constant weight. The obtained polymer had a softening temperature greater than 200 degrees Centigrade, a weight-average molecular weight ($M_w$) of 29,500 as determined by polystyrene-calibrated gel permeation chromatography, and a molecular weight dispersity (alpha)=$M_w/M_n$ of 2.8 ($M_n$ the formula is the number-average molecular weight). The average compositional formula as calculated from the $^{29}$Si-NMR spectrum was as follows ($SiO_{4/2}$ unit=1.0)

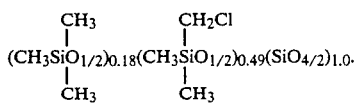

EXAMPLE 2

Substituting 5.78 g 1,3-bis(1-chloromethyl)-1,1,3,3-tetramethyldisiloxane and 16.2 g hexamethyldisiloxane for the 1-chloromethyldimethylchlorosilane of Example 1, reaction and purification were conducted under conditions otherwise the same as in Example 1. The product was a polymer with a softening temperature greater than 200 degrees Centigrade, $M_w=14,000$, alpha = 1.4, and with the average compositional formula

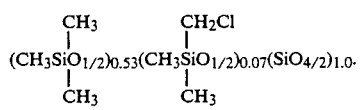

EXAMPLE 3

Reaction and purification were conducted under the same conditions as in Example 2 with the following modifications: 13.9 g 1-chloromethyldimethylmonomethoxysilane was used in place of the 1,3-bis(1-chloromethyl)-1,1,3,3-tetramethyldisiloxane in Example 2, 17.4 g vinyldimethylmonomethoxysilane was used in place of the hexamethyldisiloxane, and 76 g tetramethoxysilane was used in place of the tetraethoxysilane. The product was a polymer with a softening temperature greater than 200 degrees Centigrade, $M_w=56,600$, alpha = 2.2, and with the average compositional formula

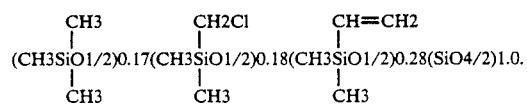

EXAMPLE 4

Reaction and purification were conducted under the same conditions as in Example 2 with the following modifications: 9.3 g 1,3-bisvinyl-1,1,3,3-tetramethyldisiloxane was used instead of the 1,3-bis(1-chloromethyl)-1,1,3,3-tetramethyldisiloxane of Example 2, and 12.2 g hexamethyldisiloxane was used. The product was a polymer with a softening temperature greater than 200 degrees Centigrade, $M_w=14,400$, alpha = 2.8, and with the average compositional formula

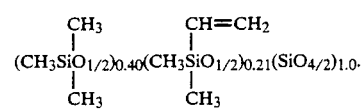

EXAMPLE 5

Reaction and purification were carried out under the same conditions as in Example 2 with the following modifications: 9.3 g 1,3-bisvinyl-1,1,3,3-tetramethyldisiloxane and 10.9 g 1,3-bisisopropyl-1,1,3,3-tetramethyldisiloxane were used in place of the 1,3-bis(1-chloromethyl)-1,1,3,3-tetramethyldisiloxane used in Example 2, and 4.1 g hexamethyldisiloxane was used.

The product was a polymer having a softening temperature greater than 200 degrees Centigrade, $M_w=10,200$, alpha = 3.3, and with the average compositional formula

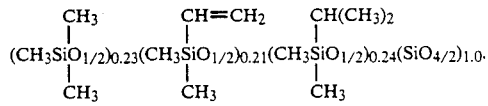

EXAMPLE 6

Reaction and purification were carried out under the same conditions as in Example 1 with the following modification: 43.2 g p-(1-chloromethyl)phenethyltrichlorosilane and 27.1 g trimethylchlorosilane were used in place of the 1-chloromethyldimethylchlorosilate used in Example 1. The product was a polymer with a softening temperature greater than 200 degrees Centigrade, $M_w=26,000$, alpha = 2.6, and with the average compositional formula

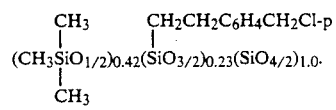

EXAMPLE 7

Reaction and purification were carried out under the same conditions as in Example 1 with the following modification: 49 g 3-mercaptopropyltrimethoxysilane and 20.3 hexamethyldisiloxane were used in place of the 1-chloromethyldimethylchlorosilane used in Example 1. The product was a polymer with a softening temperature greater than 150 degrees Centigrade, $M_w=5,900$, alpha = 1.9, and with the average compositional formula

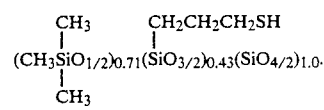

EXAMPLE 8

Reaction and purification were carried out under the same conditions as in Example 1 with the following modification: 24.8 g 3-methacryloxypropyltrimethoxysilane and 26 g trimethylmonomethoxysilane were used in place of the 1-chloromethyldimethylchlorosilane used in Example 1. The product was a polymer with a softening temperature greater than 200 degrees Centigrade, $M_w=42,000$, alpha = 3.2, and with the average compositional formula

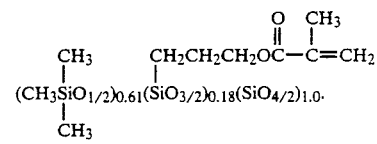

EXAMPLE 9

Reaction and purification were carried out under the same conditions as in Example 1 with the following modifications: 30.1 g dimethylvinylchlorosilane was used in place of the 1-chloromethyldimethylchlorosilane used in Example 1, and 30 g 1,3-divinyl-1,1,3,3-tetramethyldisilazane was used in place of the hexamethyldisilazane. The product was a polymer with a softening temperature greater than 200 degrees Centigrade, $M_w=17,000$, alpha=2.5, and with the average compositional formula

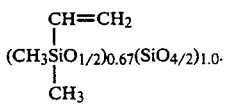

EXAMPLE 10

Reaction and purification were carried out under the same conditions as in Example 1 with the following modifications: 20.3 g trimethylchlorosilane was used in place of the 1-chloromethyldimethylchlorosilane used in Example 1, and 30 g 1,3-dihydrogen-1,1,3,3-tetramethyldisilazane was used in place of the hexamethyldisilazane. The product was a polymer with a softening temperature greater than 200 degrees Centigrade, $M_w=36,000$, alpha=2.9, and with the average compositional formula

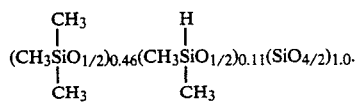

EXAMPLE 11

Reaction and purification were carried out under the same conditions as in Example 10 with the following modification: 30 g 1,3-bis(3-glycidoxypropyl)-1,1,3,3-tetramethyldisilazane was used in place of the 1,3-dihydrogen-1,1,3,3-tetramethyldisilazane used in Example 10. The product was a polymer with a softening temperature greater than 200 degrees Centigrade, $M_w=45,000$, alpha=3.0, and with the average compositional formula

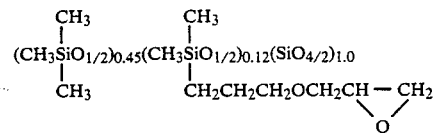

EXAMPLE 12

Into a four-neck flask equipped with a stirrer, reflux condenser, and thermometer were placed 17.1 g dimethylisopropylchlorosilane, 13.6 g trimethylchlorosilane, 40 g concentrated hydrochloric acid, 60 g water, 20 g ethanol, and 30 g toluene. The resulting mixture was heated to 70 degrees Centigrade with stirring. From an addition funnel, 104 g tetraethoxysilane was then dripped in over approximately 2 hours. After the completion of the addition, heating under reflux with stirring was continued for approximately 2 hours, 100 mL water was then added, and the lower layer was separated. This lower layer, that is, the polymer layer, was washed with water and then dehydrated azeotropically. 10 mg potassium hydroxide was added, followed by heating under reflux for 4 hours, cooling, and neutralization with trimethylchlorosilane. 20 g hexamethyldisilazane was added, and a reaction was carried out by heating under reflux with stirring for 6 hours. The obtained reaction solution was filtered, and the solvent was removed on an evaporator to afford a crude polymer as a white solid. This was dissolved in toluene to prepare the 10 weight % solution and then reprecipitated by pouring into approximately twenty-fold methanol. After collecting the precipitate by filtration, it was dried to a constant weight to give a polymer with a softening temperature greater than 200 degrees Centigrade, $M_w=13,700$, alpha=3.8, and with the following average compositional formula

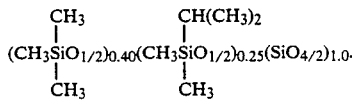

EXAMPLE 13

Reaction and purification were carried out under the same conditions as in Example 12 with the following modifications: 41 g isopropyltrimethoxysilane was used in place of the dimethylisopropylchlorosilane used in Example 12, and 26 g trimethylmonomethoxysilane was used in place of the trimethylchlorosilane. The product was a polymer with a softening temperature greater than 200 degrees Centigrade, $M_w=6,400$, alpha=2.5, and with the average compositional formula

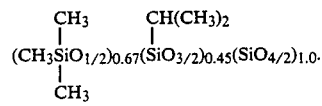

EXAMPLE 14

4.1 g hexamethyldisiloxane, 6.6 g methylvinyldimethoxysilane, 29.6 g vinyltrimethoxysilane, 40 g concentrated hydrochloric acid, 60 g water, 20 g ethanol, and 30 g xylene were placed in a set up as described in Example 1 and heated to 100 degrees Centigrade with stirring. 132 g tetrapropyloxy silane was dripped in from an addition funnel over approximately 2 hours. After the completion of addition, heating under reflux was continued for approximately 2 hours with stirring. 100 mL water was added and the lower layer was separated. This lower layer, that is, the polymer layer, was washed with water and then dehydrated azeotropically. 10 mg potassium hydroxide was added followed by heating under reflux for 4 hours, and, finally, the mixture was neutralized with trimethylchlorosilane. After the addition of 20 g hexamethyldisilazane, a reaction was carried out by heating under reflux for 6 hours with stirring. The reaction solution was then filtered, and the solvent was removed using an evaporator, thus to afford a crude polymer as a white solid. This was dissolved in toluene to 10% and reprecipitated by pouring into approximately twenty-fold methanol. The precipitate was collected by filtration and dried to a constant weight to give a polymer with a softening temperature greater than 200 degrees Centigrade, $M_w=12,000$, alpha=2.7. and with the following average compositional formula

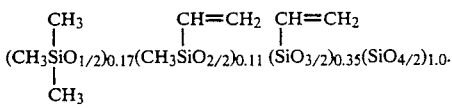

EXAMPLE 15

Reaction and purification were carried out under the same conditions as in Example 14 with the following modifications: 21.7 g trimethylchlorosilane was used in place of the hexamethyldisiloxane used in Example 14, 7.5 g t-butyldimethylchlorosilane was used in place of the methylvinyldimethoxysilane, and zero grams vinyltrimethoxysilane was used. The product was a polymer with a softening temperature greater than 200 degrees Centigrade, $M_w=52,000$, alpha=2.7, and with the following average compositional formula

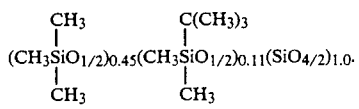

EXAMPLE 16

14.4 g polymer synthesized as in Example 1, 0.01 g 4methoxyphenol, 7.5 g sodium acrylate, 0.3 g tetrabutylphosphonium chloride, and 200 g xylene were charged to a set up as in Example 1. The resulting mixture was heated under reflux for approximately 6 hours under a nitrogen blanket. Cooling, filtration using a filtration aid, and distillation of the xylene gave a polymer with a softening temperature greater than 200 degrees Centigrade, $M_w=34,300$, alpha=2.7, and with the following average compositional formula

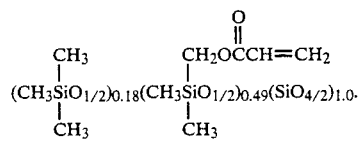

EXAMPLE 17

The polymers prepared in Examples 1 through 16 were each dissolved (10 weight % solutions) in isoamyl acetate (I), methyl isobutyl ketone (M), and n-heptane (H), and these solutions were filtered using a Teflon filter with a pore diameter of 0.2 micrometers. The filtrates were spin-coated to a thickness of approximately 0.4 micrometers on silicon wafers. After a prebake at 80 degrees Centigrade, these were exposed to an electron beam at an acceleration voltage of 20 kilovolts. After exposure, the wafer was developed with n-heptane or ethanol (E). To provide an evaluation criterion for sensitivity, the electron beam dosage for 50% retention of the initial film thickness (microcoulomb/cm2) was determined. These results are reported in Table 1 along with the minimum resolvable line/space (L/S).

TABLE 1

| Polymer | Example Number | | | | | | | |
|---|---|---|---|---|---|---|---|---|
| | 1 | 2 | 3 | 4 | 5 | 6 | 7 | 8 |
| Developer | E | E | E | I | I | E | H | H |
| $D^{EB}_{50}$ (μc/cm) | 22 | 30 | 17 | 9 | 10 | 8 | 35 | 5 |
| Minimum L/S (μm) | 0.4 | 0.4 | 0.5 | 0.8 | 0.7 | 0.6 | 0.5 | 0.9 |

| Polymer | Example Number | | | | | | | |
|---|---|---|---|---|---|---|---|---|
| | 9 | 10 | 11 | 12 | 13 | 14 | 15 | 16 |
| Developer | E | E | H | E | E | E | E | H |
| $D^{EB}_{50}$ (μc/cm) | 3 | 60 | 10 | 110 | 150 | 12 | 75 | 4 |
| Minimum L/S (μm) | 0.9 | 0.6 | 0.7 | 0.5 | 0.5 | 0.8 | 0.5 | 0.9 |

EXAMPLE 18

A commercial thermosetting polyimide resin varnish (18 weight % solids) was coated on silicon wafer to a thickness of 2 micrometers and then hardbaked for 1 hour at 200 degrees Centigrade. Each of the 16 polymer filtrates as used in Example 17 was spin-coated to a thickness of approximately 0.2 micrometers on the polyimide resin film, followed by prebaking at 80 degrees Centigrade. These were then exposed to an electron beam and developed by the same procedure as in Example 17 to form a 0.3 to 0.7 micrometer line-and-space pattern on this polyimide resin film. Subsequent to this, oxygen ion etching was carried out using a parallel-plate dry etcher (oxygen gas flow rate=50 sccm, pressure=5.0 pa, applied power density=0.05 W/cm$^2$, time=25 minutes). It was found that there was almost no reduction in the film thickness of the upper polyorganosiloxane resist layer, that the pattern in the upper resist layer was faithfully transferred to the lower layer, and that a pattern with a film thickness of approximately 2.2 micrometers was formed. Accordingly, the aspect ratio was approximately 7.3 to 3.1.

EXAMPLE 19

Polymers from Examples 1, 2, 3, 6, 7, 10, 12, 13, and 15 were processed according to the method of Example 17, but were exposed to X-rays (Cu L-line at 13.3 angstroms) instead of an electron beam. The conditions were otherwise the same as in Example 17, and the 50% film retention sensitivity $D_{50}^X$ (mJ/cm2) was determined. These results are reported in Table 2.

TABLE 2

| Polymer | Example Number | | | | | | | | |
|---|---|---|---|---|---|---|---|---|---|
| | 1 | 2 | 3 | 6 | 7 | 10 | 12 | 13 | 15 |
| Developer | E | E | E | E | H | E | E | E | E |
| $D^X_{50}$ (mj/cm$^2$) | 350 | 400 | 280 | 190 | 450 | 820 | 920 | 1120 | 750 |

EXAMPLE 20

The 10 weight % solutions (prepared as in Example 17) of the polymers from Examples 6 and 7, solutions prepared by adding 0.2 weight % 2-hydroxy-2-methylpropiophenone (A) as sensitizer to the 10 weight % solutions (prepared as in Example 17) of the polymers from Examples 9 and 16, and the solution prepared by adding 0.2 weight % 2,4-dimethylthioxanthone (B) to the 10 weight % solution (prepared as in Example 17) of the polymer from Example 8 were respectively spin-coated to a thickness of approximately 4 micrometers. The wafer, prebaked at 80 degrees Centigrade, was exposed to deep UV radiation from a 500 W Xe-Hg lamp, and the 50% film retention sensitivity DDUV50 (mJ/cm2) was determined for the particular development. Apart from this, the minimum resolvable line/space was also determined by carrying out contact exposure using a mask. These results are collectively reported in Table 3.

TABLE 3

| Polymer | Example Number | | | | |
|---|---|---|---|---|---|
| | 6 | 7 | 8 | 9 | 16 |
| Sensitizer | — | — | B | A | A |
| Developer | E | H | H | E | H |
| $D^{DUV}50$ (MJ/CM$^2$) | 110 | 220 | 65 | 92 | 60 |
| Minimum L/S (μm) | 1.0 | 1.0 | 1.2 | 1.2 | 1.2 |

EXAMPLE 21

Each of the 5 solutions of pattern-forming material used in Example 20 was spin-coated on polyimide resin film formed on silicon wafer as in Example 18. Contact exposure using a mask was carried out from a Xe-Hg lamp, and oxygen ion etching was carried out after development. For each polyorganosiloxane upper resist layer, a L/S of 0.9 to 1.0 micrometers could be formed with a thickness of approximately 2.2 micrometers without film flank spreading. Accordingly, the aspect ratio was approximately 2.4 to 2.2.

EXAMPLE 22

In this example, the silicon Wafer carried a bilayer structure. The lower layer was polyimide resin. The upper layer consisted of the pattern-forming materials used in Example 20, or the polymer from Example 1 or 3 plus 0.2 weight % sensitizer B based on polymer. After exposure using a stepper to a KrF excimer laser (wavelength=248.5 nanometers, 2 to 3 mJ/pulse) and development, the 50% film retention sensitivity DEX50 (mJ/cm2) and the minimum resolvable line/space were determined. These results are reported in Table 4.

TABLE 4

| Polymer | Example Number | | | | | | |
|---|---|---|---|---|---|---|---|
| | 1 | 3 | 6 | 7 | 8 | 9 | 16 |
| Sensitizer | B | B | — | — | B | A | A |
| Developer | E | E | E | H | H | E | H |
| $D^{EX}50$ (mj/cm$^2$) | 350 | 300 | 240 | 250 | 200 | 220 | 210 |
| Minimum L/S (μm) | 0.6 | 0.5 | 0.6 | 0.5 | 1.0 | 0.8 | 1.0 |

EXAMPLE 23

The pattern formed on the polyimide layer in Example 22 was transferred, using oxygen ion etching according to the procedure of Example 18, from the upper polyorganosiloxane layer almost without film flank spreading in the patterned layer. A submicron pattern with a film thickness of approximately 2.2 micrometers could be formed.

EXAMPLE 24

Solutions were prepared containing 10 weight % polymer from Example 6, 7, 8, 9, 11, or 16 and 0.2 weight sensitizer (B) or Michler's ketone (C) or 2 weight % crosslinker, 4,4'-diazidochalcone (D) or tetramethylolmethane tetraacrylate (E). These were spin-coated on silicon wafer and then prebaked. The wafer was exposed to ultraviolet radiation from an ultrahigh-pressure mercury lamp, and the 50% film retention sensitivity DUV50 (mJ/cm2) was determined. Also, carrying out proximity exposure using a mask, the minimum resolvable line/space was determined. These results are collectively reported in Table 5.

TABLE 5

| Polymer | Example Number | | | | | | | |
|---|---|---|---|---|---|---|---|---|
| | 6 | 7 | 8 | 8 | 9 | 11 | 16 | 16 |
| Sensitizer | B | — | B | C | — | C | B | C |
| Crosslinker | — | D | — | E | D | — | — | E |
| Developer | E | H | H | H | E | H | H | H |
| $D^{UV}50$ (mj/cm$^2$) | 50 | 63 | 20 | 15 | 30 | 50 | 18 | 15 |
| Minimum L/S (μm) | 1.1 | 1.1 | 1.3 | 1.2 | 1.2 | 1.2 | 1.3 | 1.3 |

EXAMPLE 25

Each of the 8 polymer-containing solutions used in Example 24 was spin-coated to a thickness of approximately 0.2 micrometers on a polyimide resin layer placed on a silicon wafer. After proximity exposure using a mask and development, an L/S of 0.9 to 1.2 micrometers was formed on the polyimide resin layer. This was transferred by oxygen ion etching to form a pattern with a thickness of approximately 2.2 micrometers. Accordingly, the aspect ratio was approximately 2.4 to 1.8.

Effects of the Invention

Because the pattern-forming material of this invention is based on a solvent-soluble polyorganosiloxane which consists of $SiO_{4/2}$ units and at least one other organosiloxane unit, which contains at least one group sensitive to high-energy radiation, and because the polyorganosiloxane has a softening temperature equal to or greater than room temperature, it has a superior resistance to oxygen ion etching, and consequently can be employed in the form of thin films which give high resolutions.

Highly accurate submicron patterns having unusually high aspect ratios at superior resolutions are obtained using the pattern formation method of this invention.

In a pattern formation method which employs the aforesaid pattern-forming material in a bilayer resist scheme, highly accurate submicron patterns having unusually high aspect ratios at superior resolutions are obtain.

That which is claimed is:

1. A pattern-forming material consisting essentially of a solvent-soluble polyorganosiloxane having 10 to 90 mole % $SiO_{4/2}$ units and other organosiloxane units selected from the group consisting of $R^1 SiO_{3/2}$, $R^2R^3SiO_{2/2}$, and $R^4R^5R^6SiO_{1/2}$ to make up the total constituent siloxane units, in the general formulae of the organosiloxane units, $R^1$ through $R^6$ are each a group selected from the group consisting of hydrogen, hydroxyl, and monovalent organic group, said polyorganosiloxane has a softening temperature greater than room temperature, and contains in each molecule at least one group sensitive to high-energy radiation selected from the group consisting of hydrogen bonded to silicon, alkyl groups having at least 2 carbon atoms, halogenated hydrocarbon groups, alkenyl groups, 3-acryloxypropyl, acryloxymethyl, 3-methacryloxypropyl, 3-acrylamidopropyl, 3-mercaptopropyl, 3-glycidoxypropyl, 2-(3,4-epoxycyclohexyl)ethyl, 3-aminopropyl, 3-(2-aminoethyl)aminopropyl, 2-(p-azidobenzoyl)ethyl, and 3-(p-azido-m-methylbenzoyl)propyl.

2. The pattern-forming material according to claim 1 in which the polyorganosiloxane contains 10 to 45 weight % Si.

3. The pattern-forming material according to claim 1 in which the softening temperature of the polyorganosiloxane is at least 100 degrees Centigrade.

4. The pattern-forming material according to claim 3 in which the $SiO_{4/2}$ units are present in an amount of from 45 to 65 mol % and the other organosiloxane units are present in an amount of from 35 to 55 mol %, the polyorganosiloxane contains from 30 to 45 weight % Si, and the other organosiloxane units consist essentially of from 0 to 35 mol % trimethylsiloxy units and from 4 to 45 mol % organosiloxane units with high-energy sensitive groups.

5. The pattern-forming material according to claim 4 in which the organosiloxane units with high-energy sensitive groups (monochloromethyl)dimethylsiloxy units and are present in an amount of from 4 to 30 mol %.

6. The pattern-forming material according to claim 4 in which the organosiloxane units with high-energy sensitive groups are from 10 to 15 mol % (monochloromethyl)dimethylsiloxy units and from 15 to 20 mol % vinyldimethylsiloxy units.

7. The pattern-forming material according to claim 4 in which the organosiloxane units with high-energy sensitive groups are from 10 to 45 mol % siloxane units selected from the group consisting of vinyldimethylsiloxy unit, methylvinyl-siloxane unit, vinylsilsesquioxane unit' and mixtures thereof.

8. The pattern-forming material according to claim 4 in which the organosiloxane units with high-energy sensitive groups are from 10 to 15 mol % vinyldimethylsiloxy units and from 10 to 15 mol % (isopropyl)dimethylsiloxy units.

9. The pattern-forming material according to claim 4 in which the organosiloxane units with high-energy sensitive groups are from 10 to 15 mol %

$$p-ClCH_2C_6H_4CH_2CH_2SiO_{3/2}$$

unit.

10. The pattern-forming material according to claim 4 in which the organosiloxane units with high-energy sensitive groups are from 15 to 25 mol % gamma-mercaptopropylsilsesquioxane unit.

11. The pattern-forming material according to claim 4 in which the organosiloxane units with high-energy sensitive groups are from 10 to 30 mol % siloxane units selected from the group consisting of gamma-methacryloxypropylsilsesquioxane unit and (acryloxymethyl)dimethylsiloxy unit 12. The pattern-forming material according to claim 4 in which the organosiloxane units with high-energy sensitive groups are from 5 to 10 mol % hydrogendimethylsiloxy unit.

13. The pattern-forming material according to claim 4 in which the organosiloxane units with high-energy sensitive groups are from 5 to 10 mol %

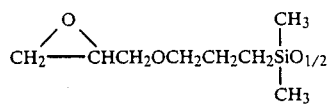

unit.

14. The pattern-forming material according to claim 4 in which the organosiloxane units with high-energy sensitive groups are from 10 to 25 mol % (isopropyl)dimethylsiloxy unit.

15. The pattern-forming material according to claim 4 in which the organosiloxane units with high-energy sensitive groups are from 5 to 10 mol % (tertiary-butyl)dimethylsiloxy unit.

16. A method for the formation of a pattern on a substrate comprising forming on a substrate a film of the pattern-forming material according to claim 1, then selectively rendering areas of this film insoluble to a liquid developer by selectively exposing the film to high-energy radiation, and thereafter removing the film in the unexposed areas using the liquid developer.

17. A method for the formation of a pattern on a substrate comprising forming a layer of an organic polymer on the substrate, placing over the organic polymer a layer of the pattern-forming material of claim 1, insolubilizing the pattern-forming material by exposure to high-energy radiation in a desired pattern, forming a pattern on the organic polymer layer by removal of the unexposed regions using liquid developer, and, using this pattern as a mask, the regions of said organic polymer layer not covered with said polyorganosiloxane are removed by dry etching with the oxygen ion.

* * * * *